United States Patent
Torii et al.

(10) Patent No.: US 7,416,940 B1
(45) Date of Patent: Aug. 26, 2008

(54) METHODS FOR FABRICATING FLASH MEMORY DEVICES

(75) Inventors: Satoshi Torii, Sunnyvale, CA (US); Hidehiko Shiraiwa, San Jose, CA (US); Youseok Suh, Cupertino, CA (US); Lei Xue, Sunnyvale, CA (US)

(73) Assignee: Spansion LLC, Sunnyvale, CA (US)

( * ) Notice: Subject to any disclaimer, the term of this patent is extended or adjusted under 35 U.S.C. 154(b) by 176 days.

(21) Appl. No.: 11/418,352

(22) Filed: May 3, 2006

(51) Int. Cl.
*H01L 21/336* (2006.01)

(52) U.S. Cl. .............. 438/257; 438/211; 438/230; 438/264; 438/288; 257/E21.21

(58) Field of Classification Search .......... 438/211, 438/230, 288, 594
See application file for complete search history.

(56) References Cited

U.S. PATENT DOCUMENTS 7,071,061 B1 * 7/2006 Pittikoun .................. 438/267

2006/0019445 A1 * 1/2006 Chen ..................... 438/257

* cited by examiner

*Primary Examiner*—Walter L. Lindsay, Jr.
*Assistant Examiner*—Kyoung Lee
(74) *Attorney, Agent, or Firm*—Ingrassia Fisher & Lorenz, P.C.

(57) ABSTRACT

Methods for fabricating a flash memory device are provided. A method comprises forming a plurality of gate stacks overlying a substrate. Each gate stack comprises a charge trapping layer and a control gate. The control gate is a first distance from the substrate. Adjacent gate stacks are a second distance apart. A cell spacer material layer is deposited and is etched to form a spacer about sidewalls of each gate stack. A source/drain impurity doped region is formed adjacent a first gate stack and a last gate stack. The first distance and the second distance are such that, when a voltage is applied to a gate stack during a READ operation, a fringing field is created between the control gate of the gate stack and the substrate and is sufficient to invert a portion of the substrate between the gate stack and an adjacent gate stack.

25 Claims, 12 Drawing Sheets

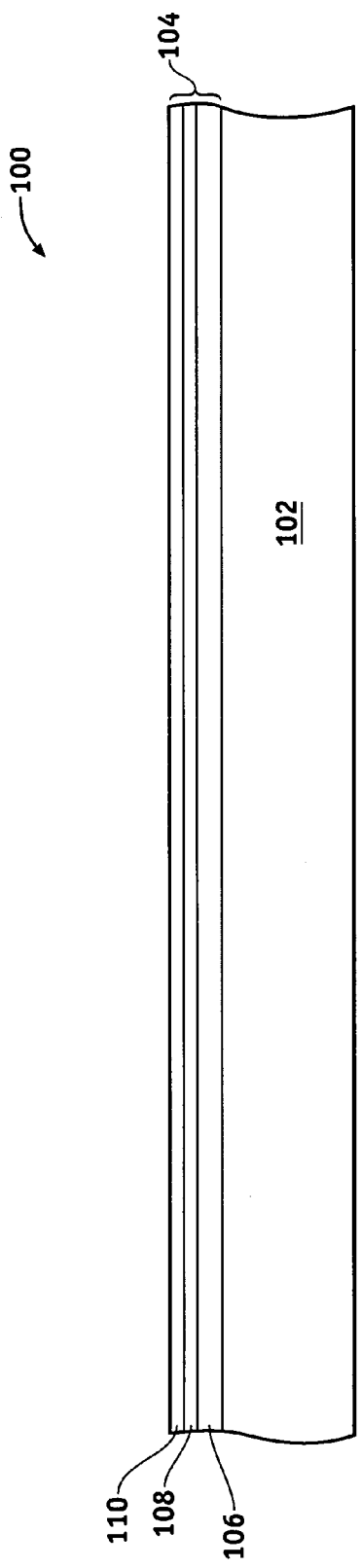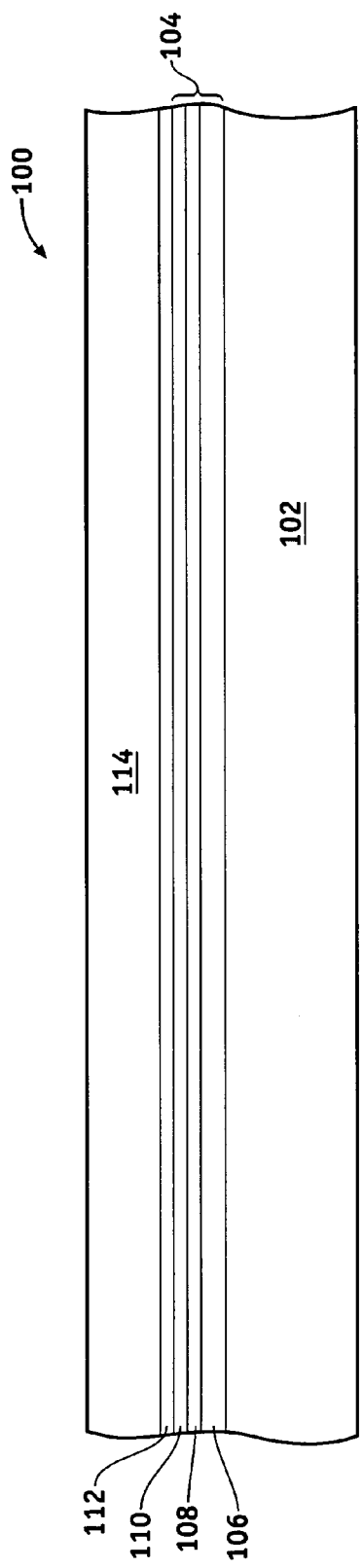
FIG. 4
FIG. 5

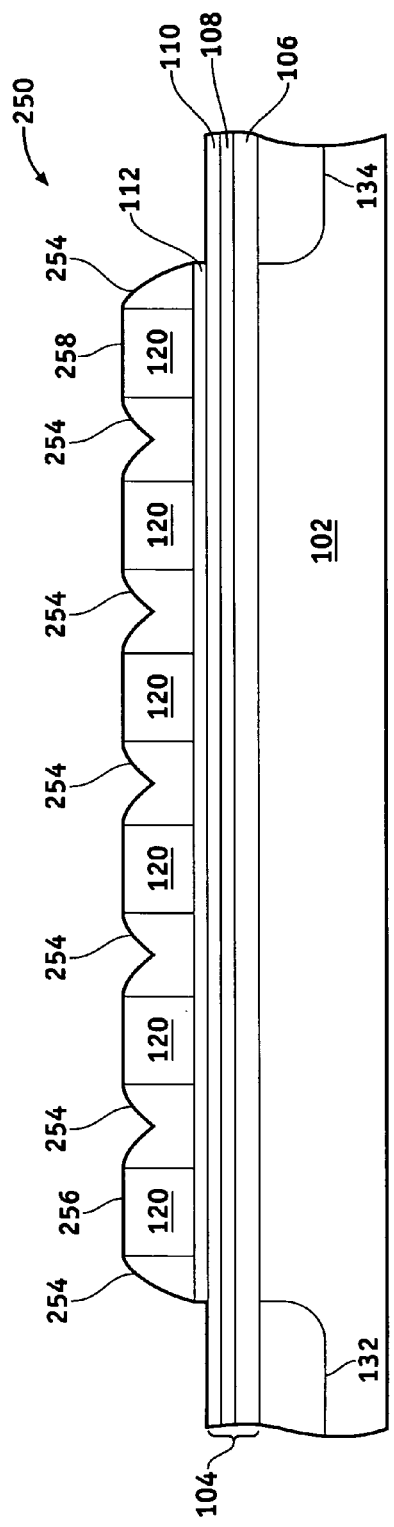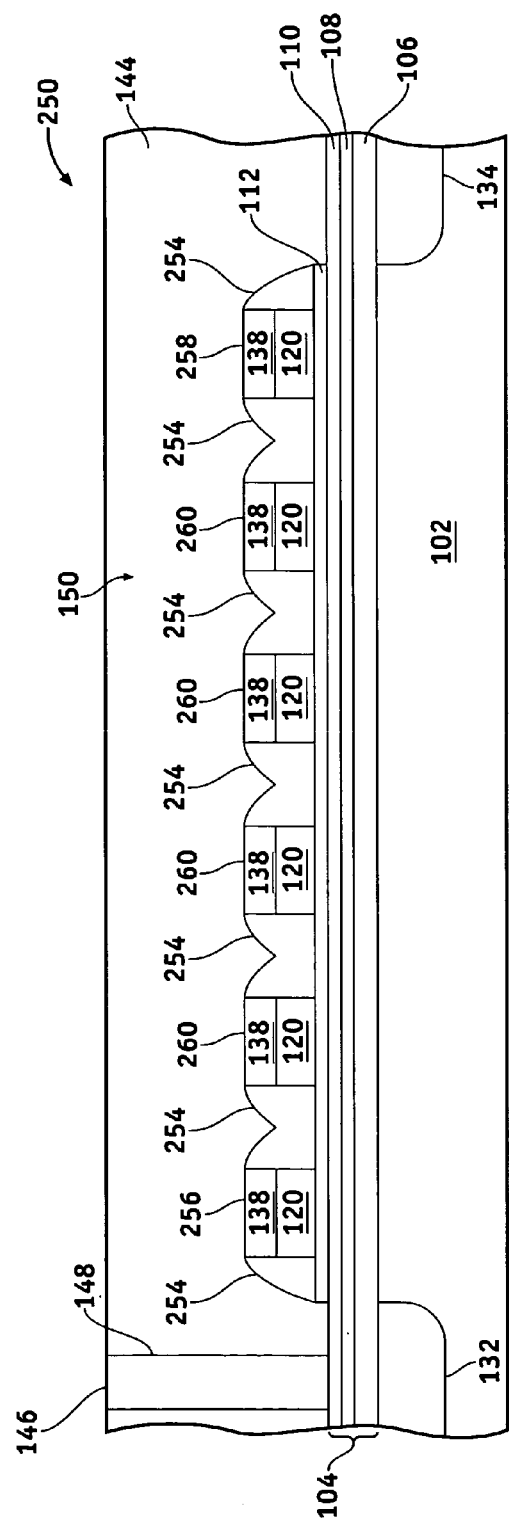

METHODS FOR FABRICATING FLASH MEMORY DEVICES

FIELD OF THE INVENTION

The present invention generally relates to semiconductor device processing, and more particularly relates to methods for fabricating flash memory devices.

BACKGROUND OF THE INVENTION

Flash and other types of nonvolatile electronic memory devices are constructed of memory cells operative to individually store and provide access to binary information or data in a nonvolatile memory. In typical nonvolatile memory architectures, each cell includes an MOS transistor structure having a source, a drain, and a channel in a substrate or P-well, as well as a stacked gate structure overlying the channel. The individual memory cells are organized into individually addressable units or groups such as bytes, which comprise eight cells, or words, which may include sixteen or more such cells, usually configured in multiples of eight. Storage of data in such memory device architectures is performed by writing to a particular set of memory cells, sometimes referred to as programming the cells. Retrieval of data from the cells is accomplished in a read operation. In addition to programming and read operations, groups of cells in a memory device may be erased, wherein each cell in the group is programmed to a known state. The bytes or words of memory cells are accessed for read, program, or erase operations through address decoding circuitry using conductive interconnects typically referred to as wordlines and bitlines.

Cells in flash memory devices may be interconnected in a variety of different configurations. One such configuration is the NAND configuration. Referring initially to FIGS. 1 and 2, a core region or portion of a NAND flash memory device 10 formed according to a conventional method comprises a NAND array 12. The NAND array 12 includes one or more cells 14, series connected source to drain within source/drain regions 16 along columns of conductive programming lines 18, commonly known as bitlines, as illustrated by the dashed line 60. Typically, a NAND array may comprise a series string of thirty-two (32) memory cells 14 between a select drain gate transistor 28 and a select source gate transistor 24, although for the sake of brevity, only four such memory cells are shown. Bitlines are selected by addressing select drain gate transistor 28. Individual cells 14 within an associated bitline 18 are selected via rows of wordlines 20 connected to the gate stack of each memory cell 14. The wordlines 20 along the bitline 18 control the flow of current between a source line structure 22 and a bitline contact region 32. Between the columns of bitlines 18 are regions of shallow trench isolation (STI) 30 to isolate and separate adjacent bitline active areas.

An N-channel NAND array 12 of FIGS. 1 and 2 comprises a P-type silicon substrate 40 within and over which are formed a plurality of memory cells 14. The memory cells 14 typically comprise a charge trapping layer such as in a conventional oxide-nitride-oxide (ONO) layer or stack 46 comprising, for example, a silicon nitride layer disposed between upper and lower silicon dioxide layers. A polysilicon gate 48 overlies the upper oxide layer of the ONO stack 46 and may be doped with an n-type impurity. A charge blocking layer, such as a high-dielectric constant material layer 50, may be disposed between the ONO stack 46 and the polysilicon gate 48. As used herein, the term "high dielectric constant material" means any insulating material having a dielectric constant greater than the dielectric constant of silicon dioxide.

Sidewall spacers 52 are disposed about the sidewalls of the memory cells 14 as well as along the sidewalls of select drain gate transistor 28, and select source gate transistor 24 and are formed of an insulating material. Cell spacers 44 overlie sidewall spacers 52 about the sidewalls of the memory cells 14, select drain gate transistor 28, and select source gate transistor 24 and are formed of another insulative material. Source/drain regions 16, lightly doped with an n-type impurity such as phosphorus or arsenic are formed between the memory gate stacks while the bitline contact region 32 and the source line structure 22 may be typically heavily doped with an additional n-type implant 42 using sidewall spacers 52 and cell spacers 44 as an impurity doping mask.

During a READ operation of a selected cell 54, a high voltage, for example, 5 volts, is applied to the unselected wordlines, the select drain gate 28, and the select source gate 24 to turn on those transistors. A READ voltage of, for example, 1 volt is applied to the word line of the selected cell. The programmed state of the selected cell is determined by monitoring whether or not current flows along the bitline of the selected cell 54. Current will flow if the READ voltage exceeds the threshold voltage ($V_T$) of the selected cell and will not flow if the selected cell has been programmed with a threshold voltage that is higher than the READ voltage.

As device densities increase and product dimensions decrease, it is desirable to reduce the size of the various structures and features associated with individual memory cells, sometimes referred to as scaling. However, the fabrication techniques used to produce conventional flash memory arrays limit or inhibit the designer's ability to reduce array dimensions. For example, in conventional array fabrication, implantation to fabricate the source/drain regions is performed after the layers of the gates are etched. However, as the source/drain regions become smaller in scale, short channel effects become a bigger challenge. In addition, etching of the ONO stacks of the gates may result in damage to the silicon nitride charge trapping layer of the ONO stacks, causing poor data retention or low gate-to-substrate breakdown voltage.

Accordingly, it is desirable to provide a method for fabricating a scaled flash memory device that overcomes short channel effects. In addition, it is desirable to provide a method for fabricating a flash memory device that minimizes damage to the charge trapping layer of the memory cells. Furthermore, other desirable features and characteristics of the present invention will become apparent from the subsequent detailed description of the invention and the appended claims, taken in conjunction with the accompanying drawings and this background of the invention.

BRIEF SUMMARY OF THE INVENTION

In accordance with an exemplary embodiment of the invention, a method for fabricating a flash memory device is provided. The method comprises the steps of providing a silicon substrate and forming a plurality of gate stacks overlying the silicon substrate. Each gate stack of the plurality of gate stacks comprises a charge trapping layer and a control gate overlying the charge trapping layer. The control gate is a first distance from the silicon substrate and each gate stack of the plurality of gate stacks is a second distance from an adjacent gate stack. A cell spacer material layer is deposited overlying the plurality of gate stacks and is etched to form a cell spacer about sidewalls of each gate stack. A source/drain impurity doped region is formed adjacent a first gate stack in the plurality of gate stacks and a source/drain impurity doped region is formed adjacent a last gate stack. The first distance and the second distance are such that, when a voltage is applied to a selected gate stack of the plurality of gate stacks during a READ operation, a fringing field is created between the control gate of the selected gate stack and the silicon substrate and is sufficient to invert a portion of the silicon substrate between the selected gate stack and an adjacent gate stack.

In accordance with another exemplary embodiment of the invention, a method for fabricating a flash memory device is provided. The method comprises the steps of providing a silicon substrate and forming a plurality of memory cells overlying the silicon substrate. A cell spacer material layer is deposited overlying the plurality of memory cells and between each memory cell. The cell spacer material layer is etched with an etch chemistry to expose a surface of each memory cell and to form a cell spacer about each memory cell. The etching is terminated before the etch chemistry etches through the cell spacer material layer to an underlying material layer. A source/drain impurity doped region is formed adjacent a first memory cell in the plurality of memory cells and a source/drain impurity doped region is formed adjacent a last memory cell. The cell spacers serve as a mask to prevent formation of source/drain impurity doped regions between adjacent memory cells of the plurality of memory cells.

In accordance with a further exemplary embodiment of the present invention, a method for fabricating a flash memory device is provided. The method comprises the steps of providing a silicon substrate and depositing a charge trapping stack comprising a charge trapping layer overlying the silicon substrate. A layer of control gate material is deposited overlying the charge trapping stack and is selectively etched to form a plurality of control gates overlying the charge trapping layer. Each of the plurality of control gates is a first distance from an adjacent control gate. A cell spacer material layer is deposited overlying the plurality of control gates to a thickness that is no less than the first distance and is etched to form a cell spacer about each control gate of the plurality of control gates. A source/drain impurity doped region is formed within the substrate adjacent a first end of the plurality of control gates and a source/drain impurity doped region is formed within the substrate adjacent a second end of the plurality of control gates. The cell spacers serve as a mask to prevent formation of source/drain impurity doped regions within the substrate between adjacent control gates of the plurality of control gates.

BRIEF DESCRIPTION OF THE DRAWINGS

The present invention will hereinafter be described in conjunction with the following drawing figures, wherein like numerals denote like elements, and wherein:

FIGS. 4-10 illustrate, in accordance with an exemplary embodiment of the present invention, a method for fabricating the portion of the NAND flash memory device of FIG. 3;

FIGS. 15-18 illustrate a method for fabricating a portion of a NAND flash memory device in accordance with a further exemplary embodiment of the present invention.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

Figure 1:
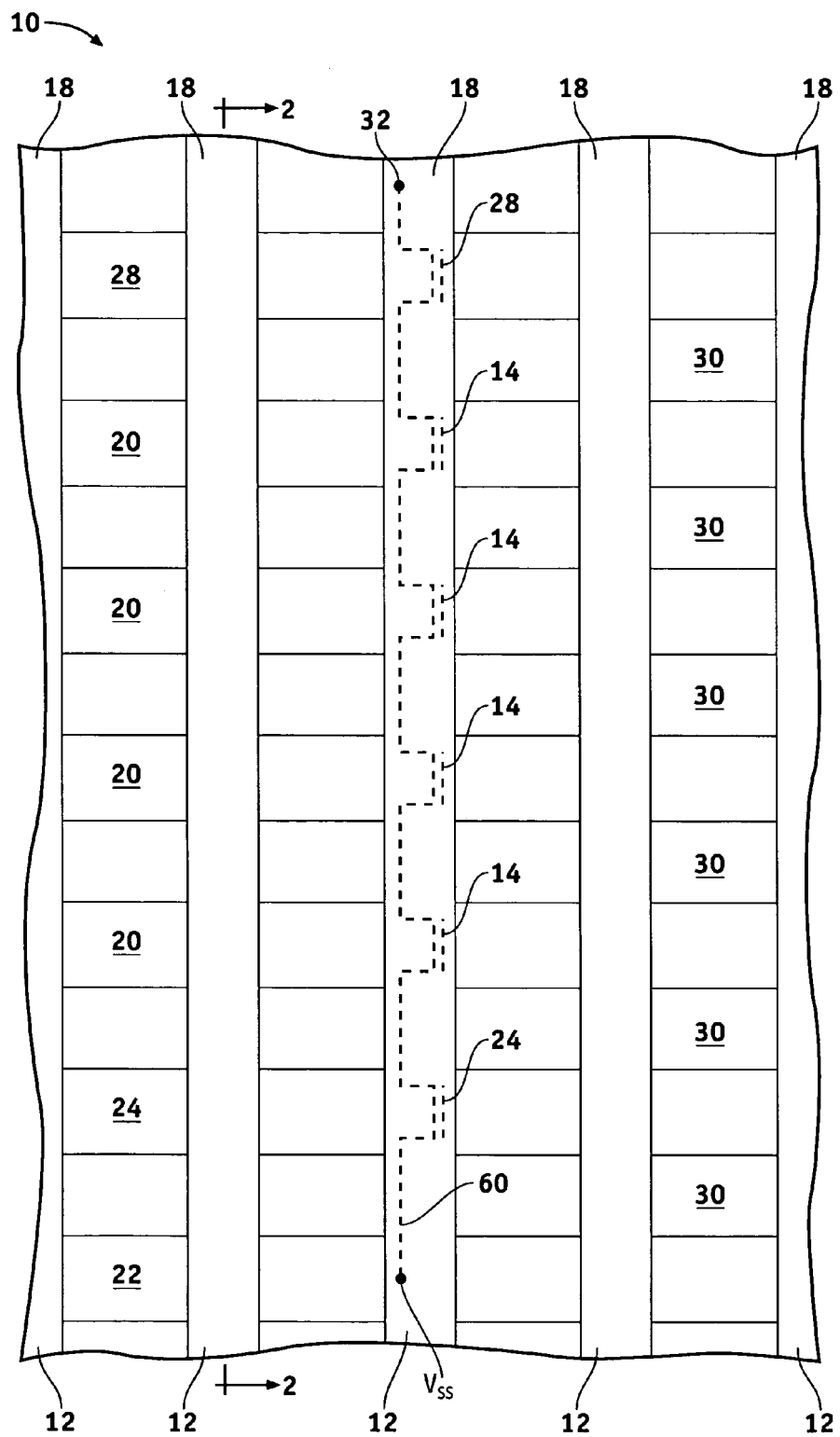
FIG. 1 is a top plan view of a portion of a conventional NAND flash memory device.
Figure 2:
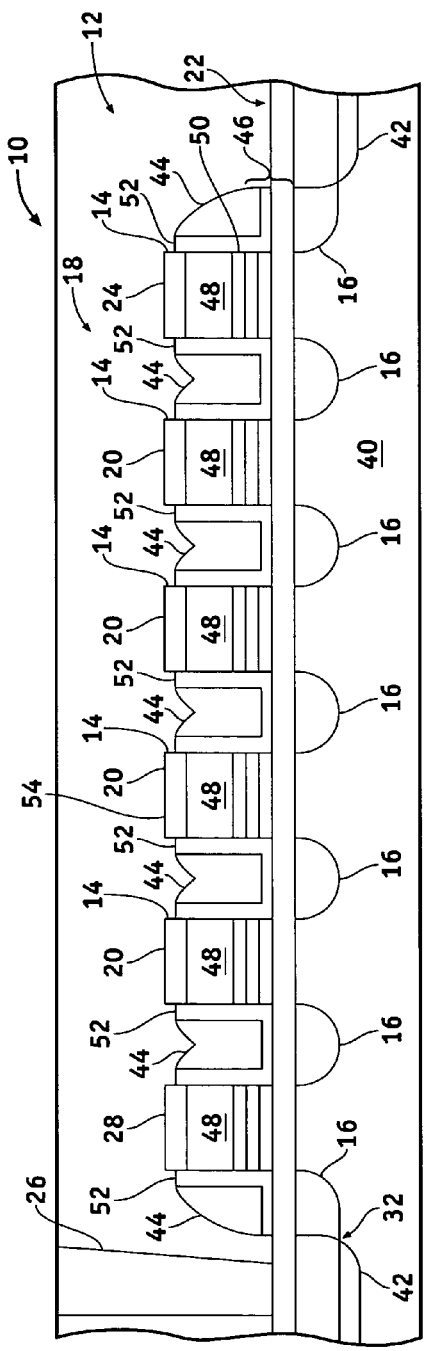
FIG. 2 is a cross-sectional view of the portion of the NAND flash memory device of FIG. 1, taken along axis 2-2.
Figure 3:
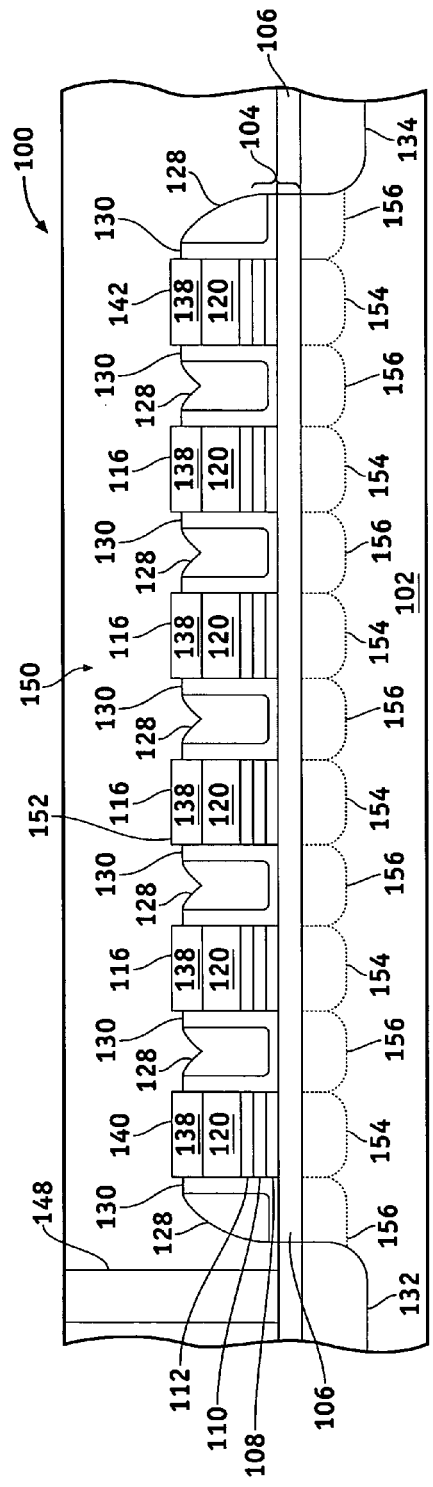
FIG. 3 is a cross-sectional view of a portion of a NAND flash memory device in accordance with an exemplary embodiment of the present invention.

Referring to FIG. 3, a portion of a flash memory device 100 is illustrated. In accordance with an exemplary embodiment of the present invention, flash memory device 100 is an N-channel NAND flash memory device, although the invention applies to any suitable flash memory device architecture. NAND flash memory device 100 can be scaled as device dimensions decrease while short channel effects may be reduced or eliminated altogether. NAND flash memory device 100 comprises a plurality of parallel conductive bitlines 150, each including a plurality of memory cells or gate stacks 116 disposed along the bitline 150. Although for the sake of brevity, only four such gate structures are shown, preferably thirty-two (32) gate stacks 116 are disposed between a select drain gate transistor 140 and a select source gate transistor 142. Individual gate stacks 116 along the associated bitline 150 are selected via rows of wordlines 138, typically metal silicide layers, connected to control gates 120 of each gate stack 116. Bitlines are selected by addressing select drain gate transistor 140. Individual gate stacks 116 within an associated bitline 150 are selected via rows of wordlines 138 connected to the gate stack 116 of each memory cell. The wordlines 138 along the bitline 150 control the flow of current between a bitline contact region 132 and a source line structure 134. Between the columns of bitlines 150 are regions of shallow trench isolation (STI) (not shown) to isolate and separate adjacent bitline active areas.

The gate stacks 116, select drain gate transistor 140, and select source gate transistor 142 are disposed on a P-type silicon substrate 102. Sidewall spacers 130 are disposed about the sidewalls of memory cells/gate stacks 116, select drain gate transistor 140, and select source gate transistor 142 and are formed of an insulating material, such as, for example, an oxide material. Cell spacers 128 overlie the sidewall spacers between the memory cells, select drain gate transistor 140, and select source gate transistor 142. If the distance between gate stacks 116 is sufficiently narrow such that a fringe field between the control gates 120 and the substrate 102 creates an inversion layer within the substrate during a READ operation, as discussed in more detail below, cell spacers 128 may be formed of an insulating material, such as a silicon oxide. Alternatively, if the distances between gate structures 116 are not so sufficiently narrow, cell spacers 128 may be formed of a high dielectric constant material, such as, for example, silicon nitride. The bitline contact region 132 and the source line region 134 are formed within substrate 102 and may be doped with an n-type impurity such as phosphorus or arsenic using sidewall spacers 130 and cell spacers 128 as a mask during impurity doping. The gate stacks 116, select drain gate transistor 140, and select source gate transistor 142 may each comprise a multi-layer dielectric-charge trapping-dielectric stack 104. Charge trapping stack 104 may comprise a conventional ONO layer or stack having, for example, a silicon nitride layer 108 disposed between upper and lower silicon dioxide layers 110 and 106, respectively. A control gate 120 is formed of polysilicon and overlies the upper oxide layer 110 of the charge trapping stack 104 of each transistor. The control gates may be formed of polysilicon and may be doped with an n-type impurity. A high-dielectric material layer 112, otherwise known as a charge blocking layer, may be disposed between the charge trapping stack 104 and the polysilicon control gate 120. Examples of high-dielectric constant material suitable for forming layer 112 include aluminum oxide ($Al_2O_3$), hafnium oxide ($HfO_2$), and the like.

As illustrated in FIG. 3, no source/drain regions are disposed within substrate 102 between gate stacks 116, the select drain gate transistor 140, and the select source gate transistor 142. Accordingly, during a READ operation of a selected cell 152 of memory cells/gate stacks 116, a voltage, for example, 5 volts, is applied to the word lines 138 of the unselected cells, the select drain gate 140 of the selected bit line, and the select source gate 142 of the selected bit line to turn on those transistors. An inversion layer 154, depicted by dashed lines in FIG. 3, is created in the silicon substrate beneath the select drain gate 140, the select source gate 142, and each gate stack 116 to which voltage is applied. A fringe field-induced inversion layer 156, also depicted in dashed lines, is created within the substrate between each gate stack 116, the select drain gate 140, and the select source gate 142 by a fringe field created by the voltage applied to the control gates 120. The fringe field spreads to the substrate through the cell spacers 128. Thus, current can flow through the inversion layers 154 and 156 from the bitline contact region 132 to the source line region 134 dependent on the memory state ($V_T$) of the selected memory cell. Because no source/drain regions are formed in the substrate between the select drain gate 140, the gate stacks 116, and the select source gate 142, device dimensions may be scaled while short channel effects are reduced, if not eliminated altogether.

Again, as described above, whether current flows through substrate 102 by fringe field-induced inversion layers 156 and inversion layers 154 depends on the $V_T$ of the selected cell 152. A small voltage, such as for example 1 volt, is applied to the selected cell 152 as a READ signal. If the memory state of the selected cell has been programmed such that the $V_T$ of the selected cell 152 is lower than the voltage of the READ signal, current will flow from the bitline contact region 132 to the source line region 134 via the inversion layers. If the memory state of the selected cell has been programmed such that the $V_T$ of the selected cell 152 is higher than the voltage of the READ signal, current will not flow.

In accordance with an exemplary embodiment of the present invention, FIGS. 4-10 illustrate a method for fabricating a flash memory device, such as NAND flash memory device 100 of FIG. 3, that can be scaled as device dimensions decrease while overcoming the challenges of short channel effects. FIGS. 4-10 illustrate various cross-sectional views of NAND flash memory device 100. Various steps in the manufacture of NAND flash memory device 100 are well known and so, in the interest of brevity, many conventional steps will only be mentioned briefly herein or will be omitted entirely without providing well known process details.

As illustrated in FIG. 4, the manufacture of NAND flash memory device 100 begins by providing a silicon substrate 102. As used herein, the term "silicon substrate" will be used to encompass the relatively pure silicon materials typically used in the semiconductor industry as well as silicon admixed with other elements such as germanium, carbon, and the like. The term "silicon substrate" also is used to encompass the substrate itself together with metal or insulator layers that may overly the substrate. Silicon substrate 102 may be a bulk silicon wafer or a thin layer of silicon on an insulating layer (commonly known as a silicon-on-insulator wafer or SOI wafer) that, in turn, is supported by a silicon carrier wafer.

A first silicon oxide layer 106 and a silicon nitride layer 108 of a multi-layer dielectric-charge trapping-dielectric stack 104, such as for example a multilayer ONO stack, are formed overlying substrate 102. The two layers may be formed using any appropriate process steps and materials, including oxidation and/or deposition techniques as are known, such as chemical vapor deposition (CVD), low pressure chemical vapor deposition (LPCVD), plasma enhanced chemical vapor deposition (PECVD), or atomic layer deposition (ALD). In the case of oxide dielectrics, any of the oxide layers can include nitrogen or other dopants for optimal device and reliability performance. In addition, the nitride layer can be rich in Si, N, and/or dopants such as oxygen to facilitate enhanced device performance and reliability performance. The layers comprising stack 104 can be any suitable multi-layer dielectric-charge trapping-dielectric stack, including, but not limited to, the ONO stack illustrated in FIG. 3 comprising first silicon oxide layer 106, silicon nitride layer 108 overlying first silicon oxide layer 106, and a second silicon oxide layer 110 overlying silicon nitride layer 108. Alternatively (although not illustrated), the layers of the completed multi-layer stack 104 overlying substrate 102 may comprise, for example, a first oxide layer overlying substrate 102, a nitride layer overlying the first oxide layer, and a high-dielectric constant charge blocking layer. In another alternative embodiment of the invention (also not illustrated), stack 104 may comprise a tunnel oxide layer, an overlying floating gate, and an overlying interlevel dielectric layer. In a preferred embodiment of the present invention, multi-layer stack 104 has a total thickness that is no greater than about 10 nm.

Referring to FIG. 5, in an exemplary embodiment of the invention, a first high-dielectric constant material layer 112 or other charge blocking layer is deposited overlying multi-layer stack 104. First high-dielectric constant material layer 112 may comprise any suitable high-dielectric constant material, such as $Al_2O_3$, $HfO_2$, or the like deposited, for example, by CVD, ALD or the like. In accordance with one embodiment of the invention, a layer preferably of polycrystalline silicon 114, or, in the alternative, metal or other conductive material, is deposited overlying the multi-layer stack 104 and, if present, the first high-dielectric constant material layer 112. The layer of polycrystalline silicon can be deposited as an impurity doped layer, but is preferably deposited as undoped polycrystalline silicon and is subsequently impurity doped by ion implantation. A layer of hard mask material (not shown) such as silicon oxide, silicon nitride, or silicon oxynitride can be deposited onto the surface of the polycrystalline silicon layer 114 to aid in subsequently patterning the polycrystalline silicon. The polycrystalline material can be deposited to a thickness of about 150 nm by LPCVD by the hydrogen reduction of silane ($SiH_4$). The hard mask material can be deposited to a thickness of about 50 nm, also by LPCVD.

Figure 6:
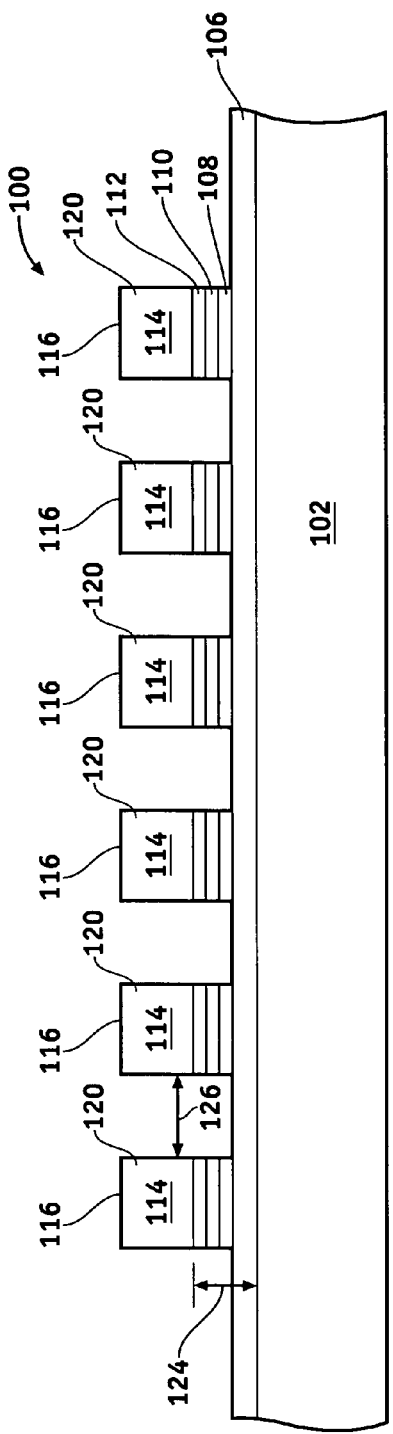

The hard mask layer and the underlying layer of polycrystalline silicon 114 are photolithographically patterned to form control gates 120, as illustrated in FIG. 6. The polycrystalline silicon can be etched in the desired pattern by, for example, plasma etching in a Cl or $HBr/O_2$ chemistry and the hard mask can be etched, for example, by plasma etching in a $CHF_3$, $CF_4$, or $SF_6$ chemistry. Following the patterning of the control gates 120, the high-dielectric constant material layer 112 and the multi-layer stack 104 are etched to expose regions of the first silicon oxide layer 106 and to define gate structures 116.

In a preferred embodiment of the invention, gate structures 116 are spaced a width, indicated by double arrowed line 126, that is no greater than about 0.1 microns apart. As described in more detail below, multi-layer stack 104 and first high-dielectric constant material layer 112 each have a thickness such that the control gates 120 are a distance, designated by double arrowed line 124, from the substrate 102.

Figure 7:
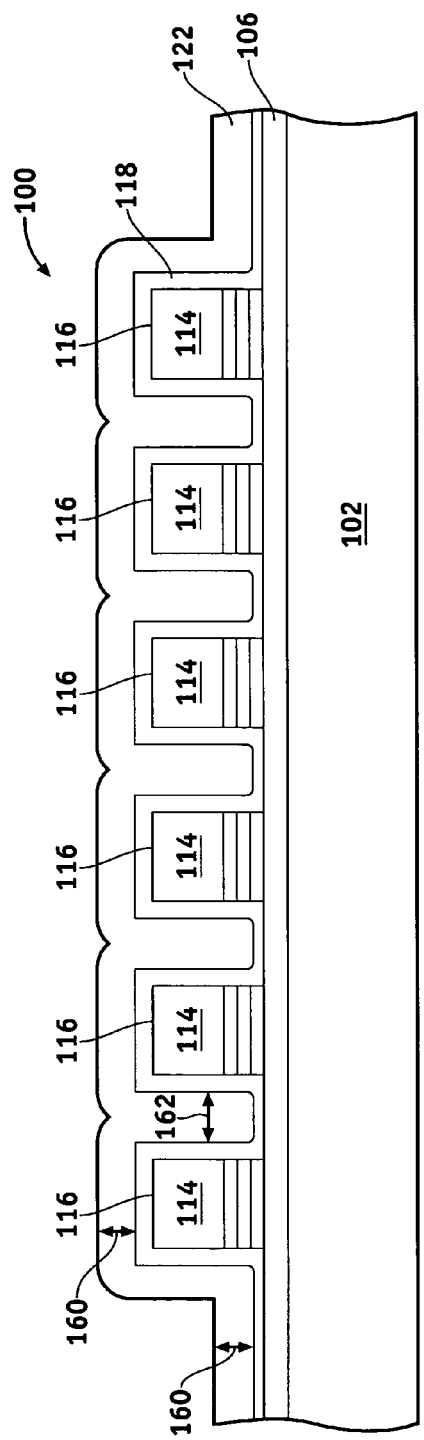

After formation of gate stacks 116 of the memory cells, a thin layer 118 of silicon oxide is deposited overlying gate structures 116 and the exposed portions of first silicon oxide layer 106, as illustrated in FIG. 7. Layer 118 can be deposited by, for example, CVD to a thickness of about 2-20 nm. A cell spacer material layer 122 then is deposited conformally overlying the thin silicon oxide layer 118. Cell spacer material layer 122 may be deposited by conventional methods such as CVD. In one embodiment of the invention, if the width 126 between gate structures 116 is sufficiently narrow such that a fringe field between the control gates 120 and the substrate 102 creates an inversion layer within the substrate during a READ operation, as described above, cell spacer material layer 122 may be formed of a suitable insulating material, such as a silicon oxide. Alternatively, if the width 126 between gate structures 116 is not so sufficiently narrow, cell spacer material layer 122 may comprise any suitable high-dielectric constant material, such as $Al_2O_3$, $HfO_2$, silicon nitride ($Si_3N_4$), or the like, and may be the same material as first high-dielectric constant material layer 112 or may be of a different material. If material layer 122 is a high-dielectric constant material, the high-dielectric constant material layer 122 is selected so that, during a READ operation of NAND flash memory device 100, a fringing field between the control gates 120 and the substrate 102 creates an inversion layer in the substrate that encompasses the entire area between adjacent gates. Cell spacer material layer 122 is deposited to a thickness indicated by double arrow line 160 that is no less than a distance indicated by double arrow line 162 between gate stacks 116 and layer 118 overlying gate stacks 116. In this regard, thickness 160 of cell spacer material layer 122 is such that, upon anisotropic etching of layer 122, described in more detail below, layer 122 is not etched entirely through between gate stacks 116 to an underlying layer, such as layer 118. In a preferred embodiment of the invention, thickness 160 is in the range of about 100 to about 200 nm.

Figure 8:
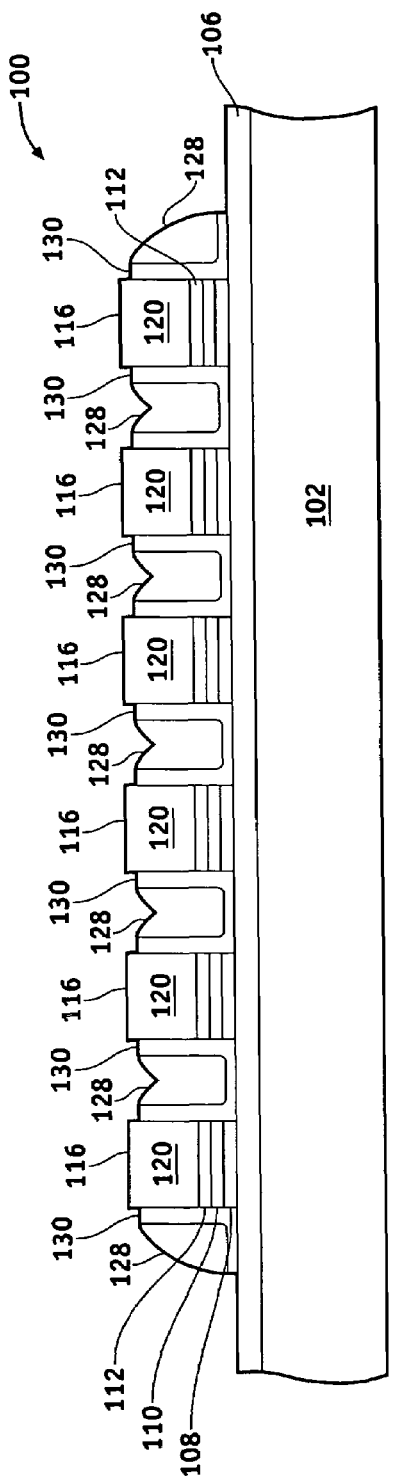

Referring to FIG. 8, cell spacer material layer 122 is anisotropically etched to form cell spacers 128 about sidewalls of each of the gate stacks 116. Cell spacer material layer 122 may be etched by, for example, reactive ion etching (RIE) using a $CHF_3$, $CF_4$, or $SF_6$ chemistry. The etch is terminated before cell spacer material layer 122 between gate stacks 116 is etched through to silicon oxide layer 118. Following formation of cell spacers 128, silicon oxide layer 118 is anisotropically etched to form sidewall spacers 130 and to expose the hard mask overlying the control gates 120. Silicon oxide layer 118 may be etched by, for example, reactive ion etching (RIE) using a $CHF_3$, $CF_4$, or $SF_6$ chemistry.

Figure 9:
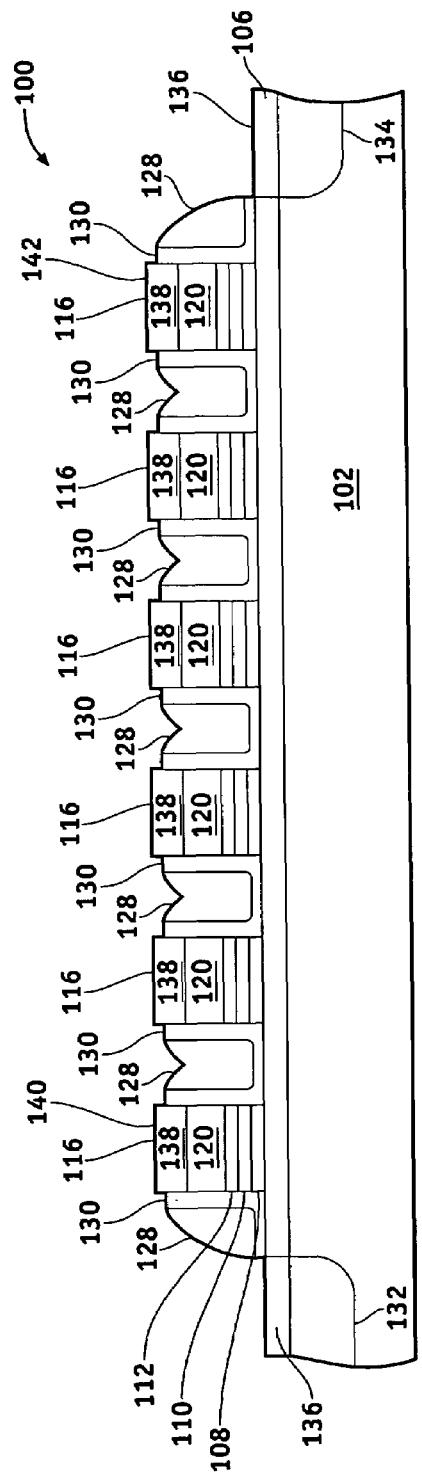

The hard mask, sidewall spacers 130, and cell spacers 128 can be used as an ion implantation mask to form bitline contact region 132 and source line region 134 in silicon substrate 102, as illustrated in FIG. 9. The bitline contact region 132 and source line region 134 are preferably formed by implanting an n-type impurity dopant, preferably arsenic ions or phosphorus ions. Bitline contact region 132 and source line region 134 preferably have a junction depth of less than about 300 nm and most preferably less than about 200 nm and are impurity doped to about 2000 ohms per square. Because the hard mask, sidewall spacers 130, and cell spacers 128 serve as an implantation mask, no source/drain regions are formed in the silicon substrate between the gate stacks 116. Following the formation of bitline contact region 132 and source line region 134, the hard mask then can be removed using conventional methods.

A layer of silicide forming metal is deposited onto the surface of the control gates 120, bitline contact region 132, and source line region 134 and is heated to form a metal silicide layer 136 on the bitline contact region and the source line region, as well as a metal silicide layer 138 on control gates 120 of gate structures 116. The layer of silicide forming metal can be, for example, cobalt, nickel, rhenium, ruthenium, or palladium, and preferably is either cobalt or nickel or nickel plus about 5% platinum. The silicide forming metal can be deposited, for example, by sputtering to a thickness of about 5-50 nm and preferably to a thickness of about 10 nm and may be heated by, for example, rapid thermal annealing (RTA). Any silicide-forming metal that is not in contact with exposed silicon, for example the silicide forming metal that is deposited on the sidewall spacers 130 and cell spacers 128, does not react during the RTA to form a silicide and may subsequently be removed by wet etching in a $H_2O_2/H_2SO_4$ or $HNO_3/HCl$ solution. The sidewall spacers 130 and cell spacers 128 disposed about the end gate stacks, also identified as a select drain gate 140 and a select source gate 142, restrict the formation of a silicide layer so that the metal silicide formed on the bitline contact region and the source line region does not contact the control gates 120 of select drain gate 140 and select source gate 142, respectively, which would cause an electrical short between the gate structures and the bitline contact region and source line region.

Figure 10:
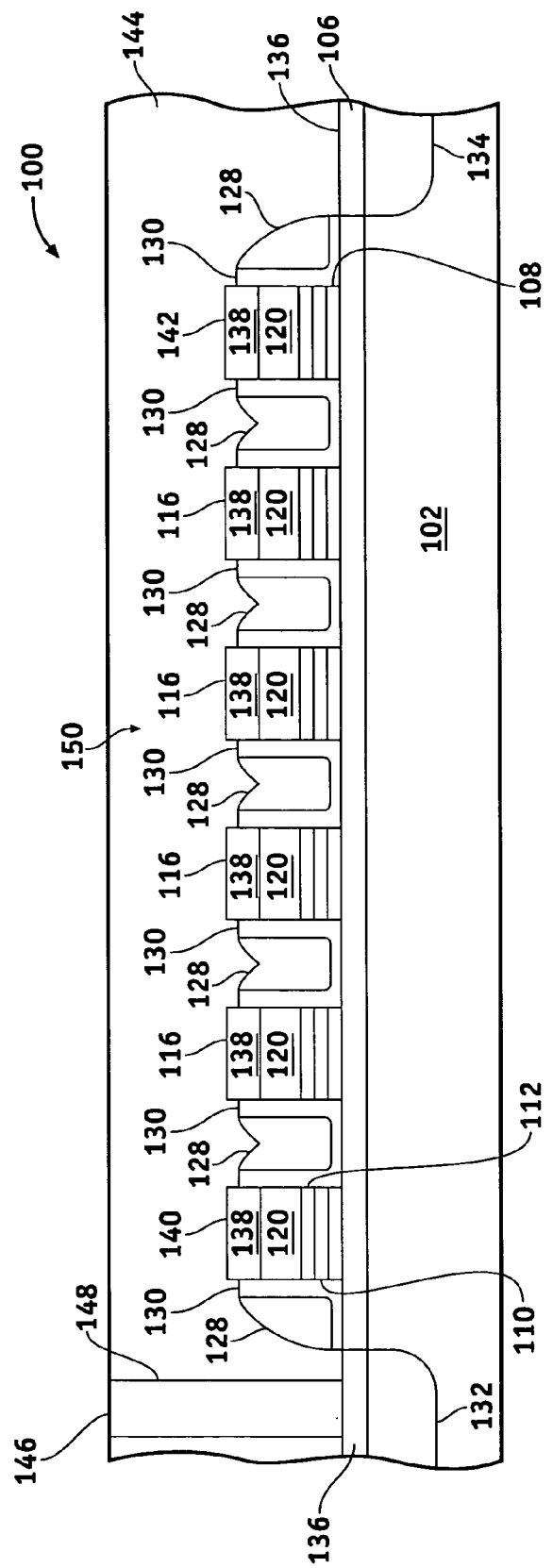

Referring to FIG. 10, after formation of the silicide layers, an insulating layer 144 is globally deposited. The insulating layer 144 may comprise any suitable insulating material such as, for example, a silicon oxide, and may be deposited by any conventional method, such as CVD, to a thickness of about 1000 nm. A via 146 then is etched through insulating layer 144 using, for example, RIE to expose silicide layer 136 on bitline contact region 132. One or more conductive materials then may be deposited within via 146 to form a conductive bitline contact 148 that is electrically coupled to bitline contact region 132 and, hence, bitline 150. In an exemplary embodiment of the present invention, a metal, such as tungsten (W), aluminum (Al), copper (Cu), gold (Au), silver (Ag), or the like, or alloys thereof, may be deposited within via 146. In another exemplary embodiment of the present invention, the conductive contact 148 may be fabricated by depositing a barrier layer, a seed layer, and a conductive core material, as is well known. The barrier layer may be formed of tantalum (Ta), tantalum nitride (TaN), tantalum silicon nitride (TaSiN), cobalt (Co), titanium nitride (TiN), ruthenium (Ru), rhodium (Rh), palladium (Pd), or any other suitable metal that hinders or prevents the ability of the conductive core material from diffusing into or otherwise adversely reacting with surrounding materials. The barrier layer may be deposited using physical vapor deposition (PVD), ionized metal plasma (IMP), CVD, or any other suitable technique known in the semiconductor industry. The seed layer also may be deposited using PVD, IMP, CVD or any other suitable technique known in the semiconductor industry. Next, the conductive core may be formed by electroplating deposition, PVD, IMP, CVD, or any other suitable method. The seed layer and the conductive core may include of tungsten (W), copper (Cu), aluminum (Al), gold (Au), silver (Ag), and the like, or any combined alloy thereof. Any excess metal deposited overlying insulating layer 144 may be removed by any suitable method such as, for example, chemical mechanical planarization (CMP), electrochemical mechanical planarization (ECMP), etching or the like.

Figure 11:
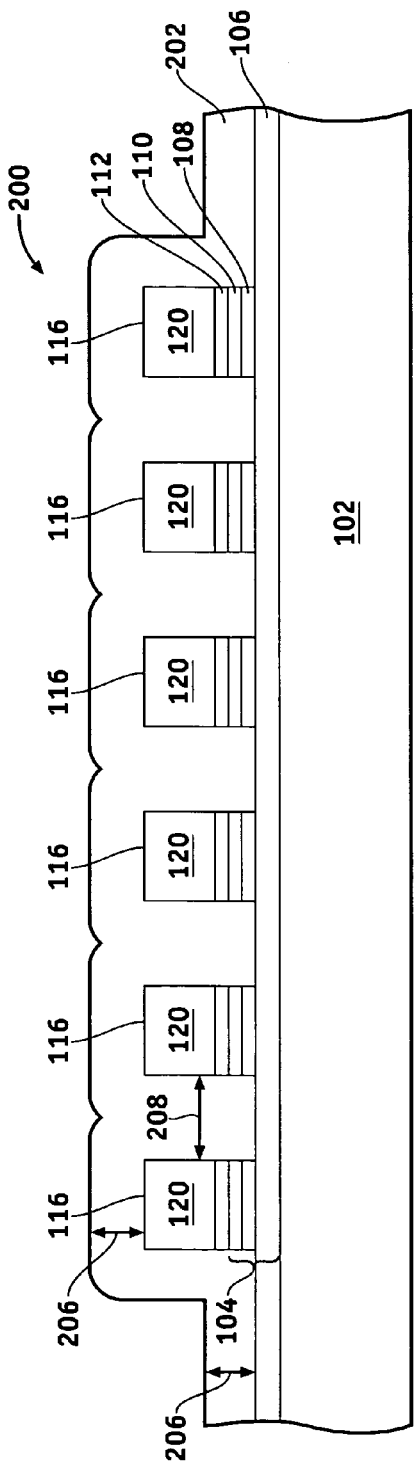
FIGS. 11-14 illustrate a method for fabricating a portion of a NAND flash memory device in accordance with another exemplary embodiment of the present invention.

FIGS. 11-14 illustrate a method for fabricating a flash memory device 200 in accordance with another exemplary embodiment of the present invention. For illustrative purposes, flash memory device 200 is illustrated in FIGS. 11-14 as a NAND flash memory device. NAND flash memory device 200 is similar to NAND flash memory device 100 and, accordingly, elements of FIGS. 11-14 that have the same reference numbers as elements of FIGS. 4-10 are the same as elements of FIGS. 4-10 and may be formed of any of the same materials and by any of the same methods as described above with reference to FIGS. 4-10. The method described with reference to FIGS. 11-14 begins by utilizing the steps described above with reference to FIGS. 4-6, which, for brevity, will not be described again. Accordingly, after performing the steps illustrated in FIGS. 4-6, a line of gate stacks 116 of memory cells are disposed overlying substrate 102. Referring to FIG. 11, after formation of gate stacks 116, a cell spacer material layer 202 is globally deposited overlying gate stacks 116 and first silicon oxide layer 106. In one embodiment of the invention, if a width between gate structures 116, indicated by double arrowed line 208, is sufficiently narrow such that a fringe field between the control gates 120 and the substrate 102 creates an inversion layer within substrate 102 during a READ operation, cell spacer material layer 202 may be formed of a suitable insulating material, such as silicon oxide. Alternatively, if the width 208 is not so sufficiently narrow, cell spacer material layer 202 may comprise any suitable high-dielectric constant material, such as $Al_2O_3$, $HfO_2$, $Si_3N_4$, or the like, and may be the same material as first high-dielectric constant material layer 112 or may be of a different material. Cell spacer material layer 202 may be deposited by known methods such as CVD and is deposited to a thickness indicated by double arrow line 206 that is no less than width 208 between gate stacks 116. In this regard, thickness 206 of cell spacer material layer 202 is such that, upon anisotropic etching of layer 202, described in more detail below, layer 202 is not etched entirely through between gate stacks 116 to an underlying layer, such as layer 106.

Figure 12:
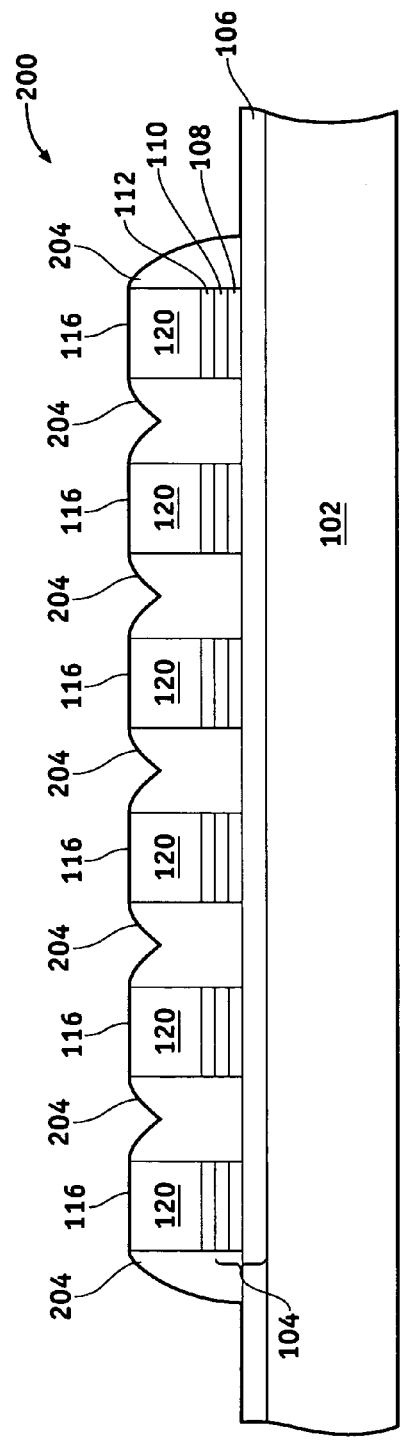
Figure 13:
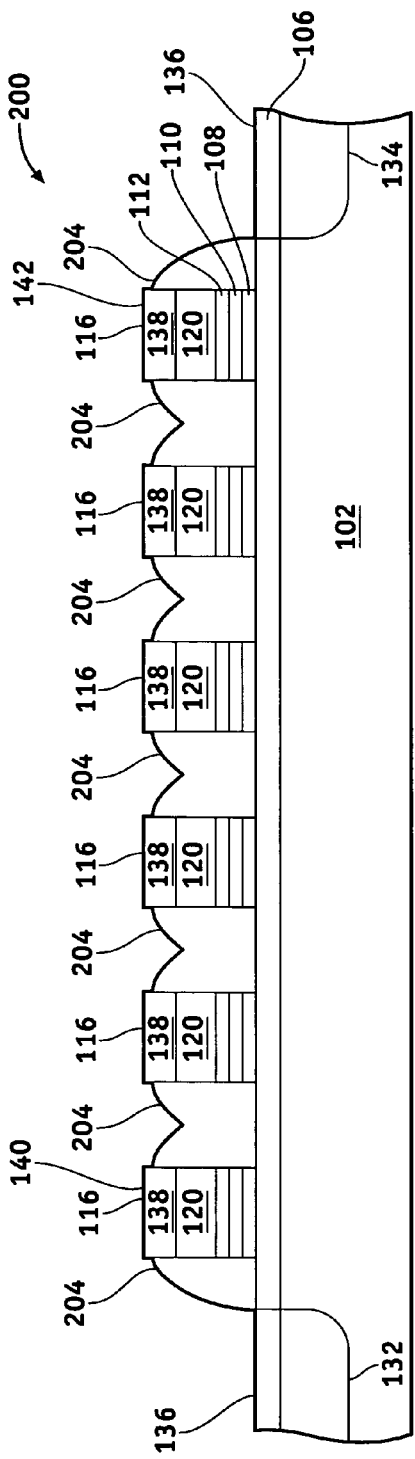

Referring to FIG. 12, cell spacer material layer 202 is anisotropically etched to form cell spacers 204 that are disposed about sidewalls of gate stacks 116 and to expose the hard mask overlying control gates 120. Cell spacer material layer 202 may be anisotropically etched as described above with reference to FIG. 8. The etch is terminated before cell spacer material layer 202 is etch through to oxide layer 106 between gate stacks 116. Gate stacks 116 and cell spacers 204 then can be used as an ion implantation mask to form bitline contact region 132 and source line region 134 in silicon substrate 102, as illustrated in FIG. 13. Because gate stacks 116 and cell spacers 204 serve as an implantation mask, no source/drain regions are formed within the substrate between adjacent gate stacks 116. Accordingly, because no source/drain regions are formed in the substrate between the select drain gate 140, the gate stacks 116, and the select source gate 142, device dimensions may be scaled while short channel effects are reduced, if not eliminated altogether. The hard mask layer then can be removed from control gates 120.

A layer of silicide forming metal is deposited onto the surface of the control gates 120, bitline contact region 132, and source line region 134 and is heated to form a metal silicide layer 136 on the bitline contact region and the source line region as well as a metal silicide layer 138 on control gates 120 of memory cells 116. The silicide forming metal may be heated by, for example, RTA. Any silicide-forming metal that is not in contact with exposed silicon, for example, the silicide forming metal that is deposited on the cell spacers 204, does not react during heating to form a silicide and may subsequently be removed by wet etching as described above. The cell spacers 204 disposed about the end memory cells, that is, select drain gate 140 and select source gate 142, restrict the formation of a silicide layer so that the metal silicide formed on the bitline contact region and the source line region does not contact the control gates 120 of select drain gate 140 and select source gate 142, respectively, which would cause an electrical short between the gate structures and the bitline contact region and source line region.

Figure 14:
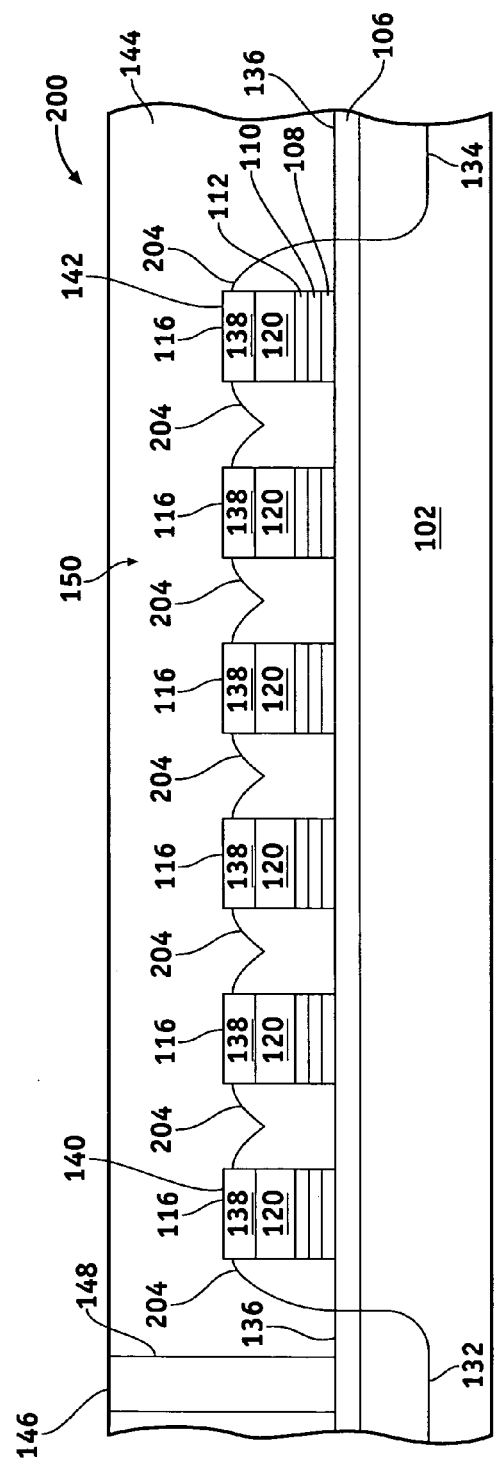

Referring to FIG. 14, after formation of the silicide layers, insulating layer 144 is globally deposited, as described above. Via 146 then is etched through insulating layer 144 using any known method to expose silicide layer 136 on bitline contact region 132. One or more conductive materials then is deposited within the via 146 to form bitline contact 148 to bitline 150.

Figure 15:
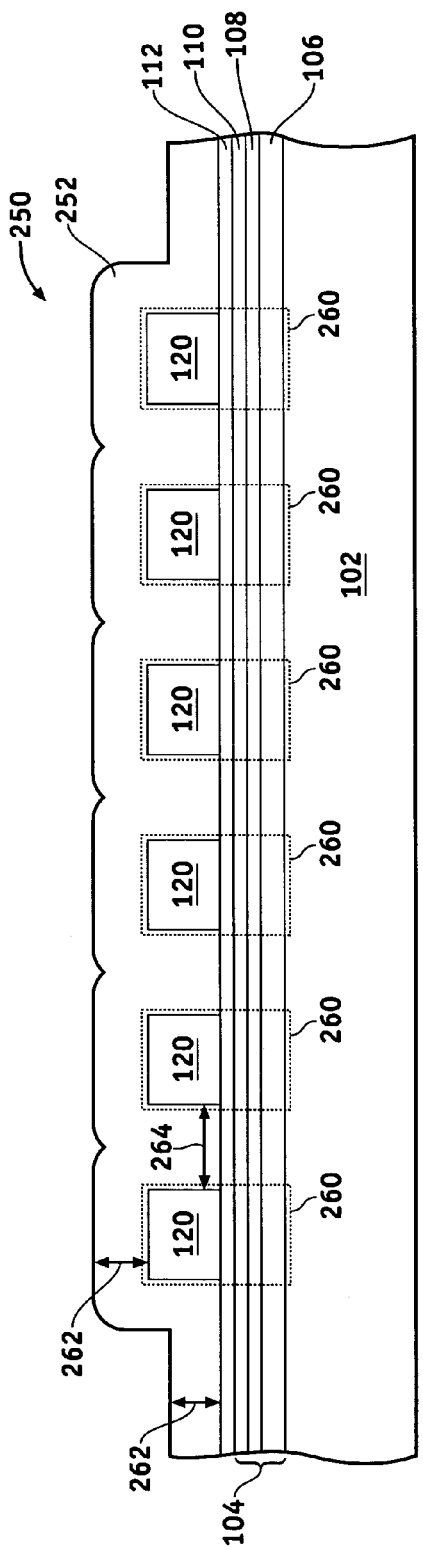

FIGS. 15-18 illustrate a method for forming a flash memory device 250 in accordance with yet another exemplary embodiment of the present invention. For illustration purposes, flash memory device 250 will be illustrated as a NAND flash memory device. NAND flash memory device 250 is similar to NAND flash memory device 100 and, accordingly, elements of FIGS. 15-18 that have the same reference numbers as elements of FIGS. 4-10 are the same as elements of FIGS. 4-10 and may be formed of any of the same materials and by any of the same methods as described above with reference to FIGS. 4-10. The method described with reference to FIGS. 15-18 begins by utilizing the steps described above with reference to FIGS. 4 and 5, which, for brevity, will not be described again. Referring to FIG. 15, after formation of polysilicon layer 114, a layer of hard mask material (not shown) such as silicon oxide, silicon nitride, or silicon oxynitride is deposited onto the surface of the polycrystalline silicon layer 114 to aid in subsequently patterning the polycrystalline silicon. The hard mask layer and the underlying layer of polycrystalline silicon 114 are photolithographically patterned to form a column of control gates 120 and, hence, a column of memory cell/gate stacks 260, which are indicated by dashed lines. The polycrystalline silicon and the hard mask can be etched as described above.

After formation of control gates 120, a cell spacer material layer 252 may be conformally deposited overlying control gates 120. In one embodiment of the invention, if a width between gate structures 116, indicated by double arrowed line 264, is sufficiently narrow such that a fringe field between the control gates 120 and the substrate 102 creates an inversion layer within substrate 102 during a READ operation, cell spacer material layer 252 may be formed of a suitable insulating material, such as silicon oxide. Alternatively, if the width 264 is not so sufficiently narrow, cell spacer material layer 252 may comprise any suitable high-dielectric constant material, such as $Al_2O_3$, $HfO_2$, $Si_3N_4$, or the like, and may be the same material as first high-dielectric constant material layer 112 or may be of a different material. Cell spacer material layer 252 may be deposited by known methods such as CVD and is deposited to a thickness indicated by double arrow line 262 that is no less than width 264. In this regard, thickness 262 of cell spacer material layer 252 is such that, upon anisotropic etching of layer 252, described in more detail below, layer 252 is not etched entirely through between control gates 120 to an underlying layer, such as first high dielectric constant material layer 112.

Figure 16:
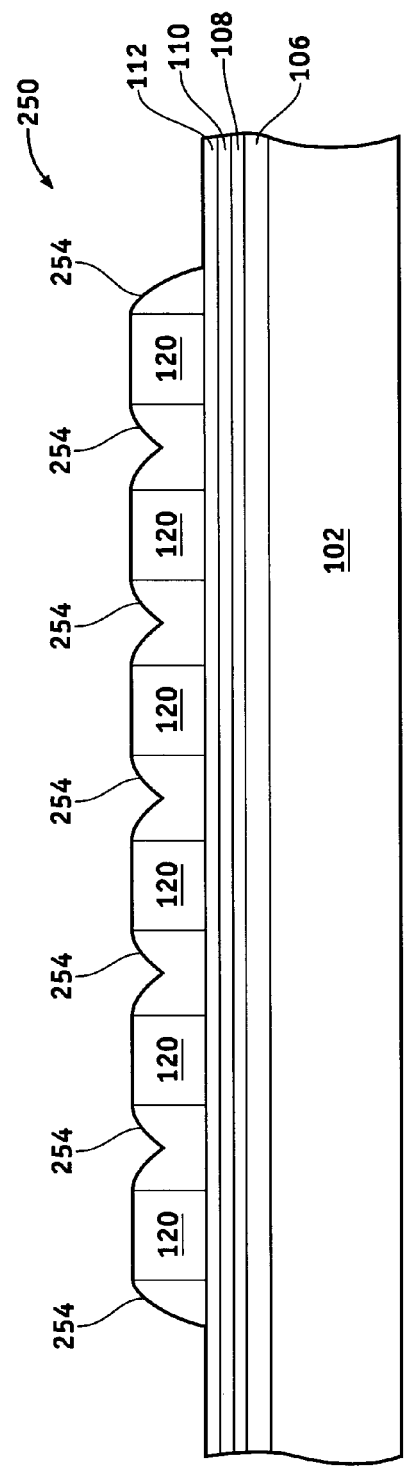

Referring to FIG. 16, cell spacer material layer 252 is anisotropically etched as described above with reference to FIG. 8 to form cell spacers 254 that are disposed about the sidewalls of control gates 120. The etch is terminated before cell spacer material layer 252 is etched through to first high dielectric constant material layer 112. The hard mask and cell spacers 254 then can be used as a mask to remove exposed portions of first high-dielectric constant material layer 112 that do not underlie control gates 120 or cell spacers 254, as illustrated in FIG. 17. Subsequently, the hard mask and cell spacers 254 can be used as an ion implantation mask to form bitline contact region 132 adjacent a select drain gate 256 and source line region 134 adjacent a select source gate 258 in silicon substrate 102. The hard mask and cell spacers 254 serve as an implantation mask such that no source/drain regions are formed within the substrate between adjacent gate stacks. Because source/drain regions are not formed within substrate 102 between select drain gate 256, gate stacks 260, and select source gate 258, device dimensions may be scaled while short channel effects are reduced, if not eliminated altogether. In addition, steps otherwise necessary to etch stack 104 to form the memory cells can be eliminated. Such steps often cause damage to the charge trapping layer of stack 104, which results in poor data retention and low gate-to-substrate breakdown voltage. With the elimination of such steps, damage to stack 104 may be reduced or avoided. The hard mask then can be removed by conventional methods. A layer of silicide forming metal is globally deposited and is heated as described above to form a metal silicide layers 138 on control gates 120, as illustrated in FIG. 18. Following formation of the silicide layers, insulating layer 144 is globally deposited and via 146 then is etched through insulating layer 144 as described above to expose bitline contact region 132. One or more conductive materials then is deposited within the via 146 to form bitline contact 148 to bitline 150.

Figure 19:
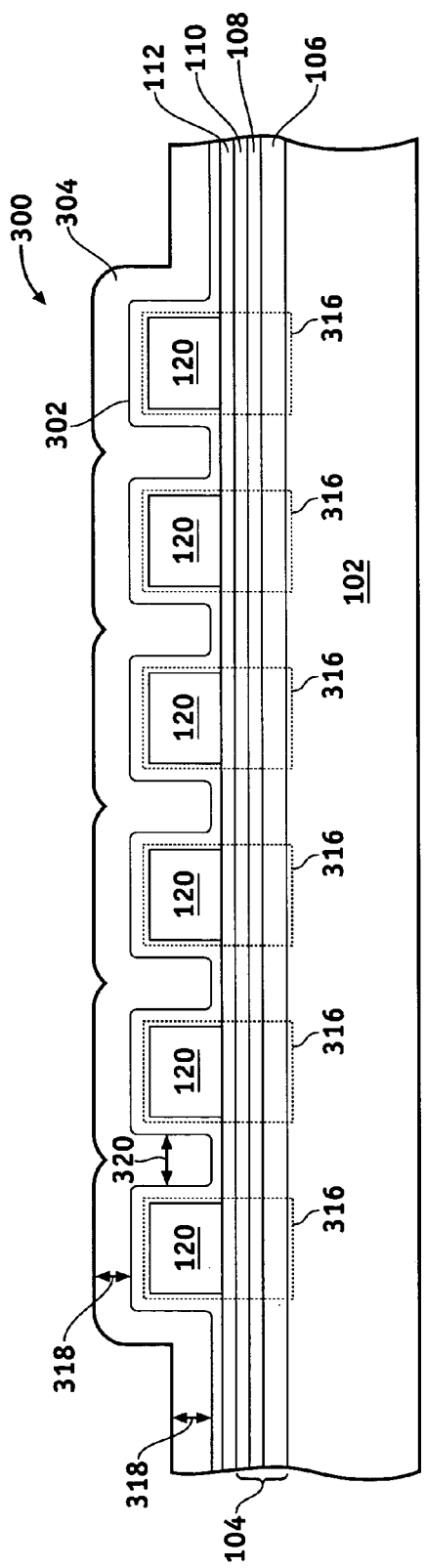
FIGS. 19-22 illustrate a method for fabricating a portion of a NAND flash memory device in accordance with yet another exemplary embodiment of the present invention.

In accordance with a further exemplary embodiment of the present invention, FIGS. 19-22 illustrate a method for forming a flash memory device 300. Flash memory device 300 may comprise any suitable architecture and, for illustration purposes, will be shown in FIGS. 19-22 as a NAND flash memory device. NAND flash memory device 300 is similar to NAND flash memory device 100 and, accordingly, elements of FIGS. 19-22 that have the same reference numbers as elements of FIGS. 4-10 are the same elements of FIGS. 4-10 and may be formed of any of the same materials and by any of the same methods as described above with reference to FIGS. 4-10. The method described with reference to FIGS. 19-22 begins by utilizing the steps described above with reference to FIGS. 4 and 5, which, for brevity, will not be described again. Referring to FIG. 19, after formation of polysilicon layer 114, a layer of hard mask material (not shown) such as silicon oxide, silicon nitride, or silicon oxynitride is deposited onto the surface of the polycrystalline silicon layer 114 to aid in subsequently patterning the polycrystalline silicon. The hard mask layer and the underlying layer of polycrystalline silicon 114 are photolithographically patterned to form a column of control gates 120 and, hence, a column of memory cell/gate stacks 316, which are indicated by dashed lines. The polycrystalline silicon and the hard mask can be etched as described above.

After formation of control gates 120, a thin layer 302 of silicon oxide is deposited overlying control gates 120 and first high-dielectric constant material 112. Layer 302 can be grown to a thickness of about 2-20 nm by, for example, CVD. A cell spacer material layer 304 then is deposited overlying the thin silicon oxide layer 302. In one embodiment of the invention, if a width between gate structures 116, indicated by double arrowed line 320, is sufficiently narrow such that a fringe field between the control gates 120 and the substrate 102 creates an inversion layer within substrate 102 during a READ operation, cell spacer material layer 304 may be formed of a suitable insulating material, such as silicon oxide. Alternatively, if the width 320 is not so sufficiently narrow, cell spacer material layer 304 may comprise any suitable high-dielectric constant material, such as $Al_2O_3$, $HfO_2$, $Si_3N_4$, or the like, and may be the same material as first high-dielectric constant material layer 112 or may be of a different material. Cell spacer material layer 304 is deposited to a thickness indicated by double arrow line 318 that is no less than width 320 between layer 302 overlying control gates 120. In this regard, thickness 318 of second high-dielectric constant material layer 304 is such that, upon anisotropic etching of layer 304, described in more detail below, layer 304 is not etched entirely through between control gates 120 to an underlying layer, such as layer 302.

Figure 20:
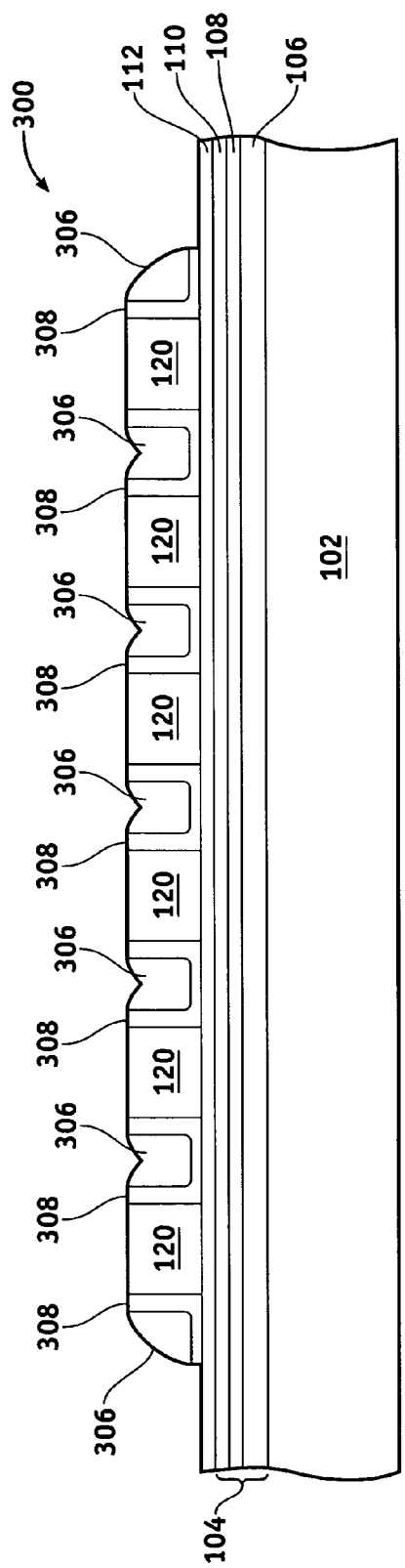
Figure 21:
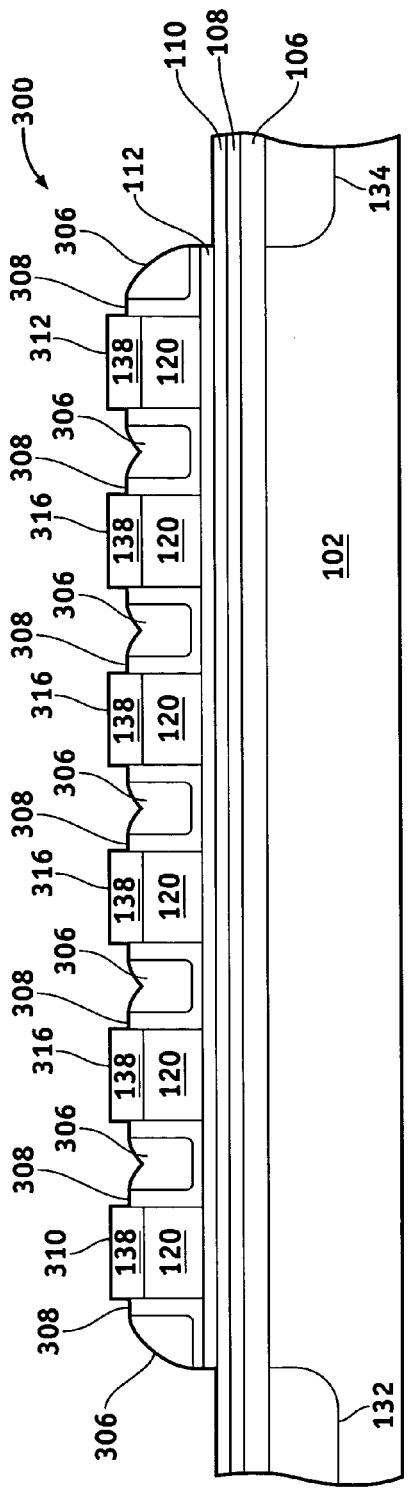

Referring to FIG. 20, cell spacer material layer 304 is anisotropically etched to form cell spacers 306. The etch is terminated before cell spacer material 304 is etched through to silicon oxide layer 302. Following formation of cell spacers 306, silicon oxide layer 302 is anisotropically etched to form sidewall spacers 308 and to expose the hard mask overlying the control gates 120. The hard mask, sidewall spacers 308, and cell spacers 306 can be used as a mask to remove exposed portions of first high dielectric constant material layer 112 that do not underlie control gates 120 or sidewall spacers 308, as illustrated in FIG. 21. The hard mask, sidewall spacers 308, and cell spacers 306 then can be used as an ion implantation mask to form bitline contact region 132 adjacent a select drain gate 310 and source line region 134 adjacent a select source gate 312 in silicon substrate 102. The hard mask may be removed using any well-known method.

A layer of silicide forming metal is globally deposited and is heated to form a metal silicide layer 138 on control gates 120. Any silicide-forming metal that is not in contact with exposed silicon, for example the silicide forming metal that is deposited on the cell spacers 306 and sidewall spacers 308 and on second oxide layer 110, does not react during heating to form a silicide and may subsequently be removed. Again, because source/drain regions are not formed within substrate 102 between select drain gate 310, gate stacks 316, and select source gate 312, device dimensions can be scaled while short channel effects are reduced, if not eliminated altogether. In addition, steps otherwise necessary to etch stack 104 to form the memory cells/gate stacks can be eliminated.

Figure 22:
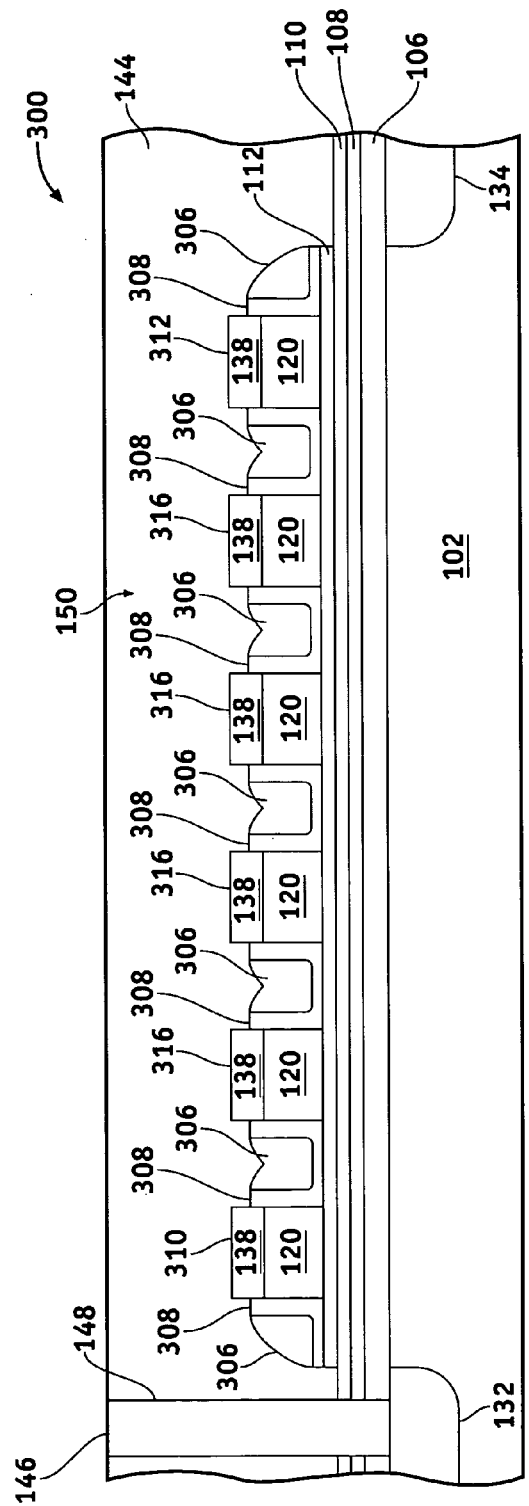

Referring to FIG. 22, following formation of the silicide layers, insulating layer 144 is globally deposited and via 146 then is etched through insulating layer 144 as described above to expose bitline contact region 132. One or more conductive materials is deposited within the via 146 to form bitline contact 148 to bitline 150.

Thus, in accordance with the various embodiments of the present invention, a flash memory device may be formed that can be scaled for reduced device dimensions while overcoming the challenges of short channel effects. In addition, by eliminating etching steps, various embodiments of the present invention provide a flash memory device wherein damage to charge trapping layers of the device is reduced or eliminated altogether. While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A method for fabricating a flash memory device, the method comprising the steps of:
    providing a silicon substrate;
    forming a plurality of gate stacks overlying said silicon substrate, wherein each of said plurality of gate stacks comprises a charge trapping layer and a control gate overlying said charge trapping layer, wherein said control gate is a first distance from said silicon substrate and wherein each gate stack of said plurality of gate stacks is a second distance from an adjacent gate stack;
    depositing a cell spacer material layer overlying said plurality of gate stacks;
    etching said cell spacer material layer to form a cell spacer about sidewalls of each of said plurality of gate stacks; and
    forming a first impurity doped region adjacent a first gate stack in said plurality of gate stacks and a second impurity doped region adjacent a last gate stack in said plurality of gate stacks,
    wherein, said first distance and said second distance are such that, when a voltage is applied to a selected gate stack of said plurality of gate stacks during a READ operation, a fringing field is created between said control gate of said selected gate stack and said silicon substrate and is sufficient to invert a portion of said silicon substrate between said selected gate stack and an adjacent gate stack.

2. The method of claim 1, wherein the step of depositing a cell spacer material layer comprises the step of depositing a high dielectric constant material layer.

3. The method of claim 1, wherein the step of forming a plurality of gate stacks overlying said silicon substrate comprises the steps of:
    forming overlying said silicon substrate a charge trapping stack comprising a charge trapping layer overlying a first oxide layer;
    depositing a high dielectric constant material overlying said charge trapping stack;
    depositing a polysilicon layer overlying said high dielectric constant material;
    forming a patterned hard mask overlying said polysilicon layer; and
    etching said polysilicon layer to form a plurality of control gates overlying said charge trapping stack.

4. The method of claim 3, further comprising the step of etching said high dielectric constant material using said cell spacers as a mask.

5. The method of claim 3, further comprising the steps of:
    conformally depositing a silicon oxide layer overlying said plurality of control gates after the step of etching said polysilicon layer to form a plurality of control gates and before the step of depositing said cell spacer material layer;
    after the step of etching said cell spacer material layer, anisotropically etching said silicon oxide layer to expose a portion of each gate stack of said plurality of control gates and to form sidewall spacers about said sidewalls of each gate stack of said plurality of gate stacks; and
    etching said high dielectric constant material using said cell spacers and said sidewall spacers as a mask.

6. The method of claim 3, further comprising the steps of:
    before the step of depositing a cell spacer material layer and after the step of etching said polysilicon layer, removing exposed portions of said high dielectric constant material; and
    removing exposed portions of said charge trapping layer to expose portions of said first oxide layer that do not underlie said control gates and to form said plurality of gate stacks.

7. The method of claim 6, further comprising the step of depositing a second oxide layer overlying said plurality of gates stacks and said exposed portions of said first oxide layer, wherein said step of depositing a second oxide layer is performed before the step of depositing a cell spacer material layer and after the step of removing portions of said charge trapping layer.

8. The method of claim 7, further comprising the step of etching said second oxide layer to form sidewall spacers about sidewalls of each of said plurality of gates stacks, the step of etching said second oxide layer performed before the step of forming said first and second impurity doped regions and after the step of etching said cell spacer material layer.

9. The method of claim 1, further comprising the steps of:
    after the step of forming a first impurity doped region and a second impurity doped region, depositing an insulating layer overlying the plurality of gate stacks and the first and second impurity doped regions;
    etching a via through said insulating layer to said first impurity doped region; and
    forming a conductive contact within said via, wherein said conductive contact is in electrical contact with said first impurity doped region.

10. A method for fabricating a flash memory device, the method comprising the steps of:
    providing a silicon substrate;
    forming a plurality of memory cells overlying said silicon substrate;
    depositing a high dielectric constant material layer as a cell spacer material layer overlying said plurality of memory cells and between each memory cell of said plurality of memory cells;
    etching said cell spacer material layer with an etch chemistry to expose a surface of each memory cell of said plurality of memory cells and to form a cell spacer about each memory cell of said plurality of memory cells, wherein said etching is terminated before said etch chemistry etches through said cell spacer material layer between said memory cells to an underlying material layer; and
    forming a source/drain impurity doped region adjacent a first memory cell in said plurality of memory cells and a source/drain impurity doped region adjacent a last memory cell in said plurality of memory cells, wherein said cell spacers serve as a mask to prevent formation of said source/drain impurity doped regions between adjacent memory cells of said plurality of memory cells.

11. The method of claim 10, wherein the step of forming a plurality of memory cells comprises the steps of:
    forming overlying said silicon substrate a charge trapping stack comprising a charge trapping layer overlying an oxide layer;
    depositing a high dielectric constant material overlying said charge trapping stack;
    depositing a polysilicon layer overlying said high dielectric constant material;
    forming a patterned mask overlying said polysilicon layer; and etching said polysilicon layer to form a plurality of control gates overlying said charge trapping stack.

12. The method of claim 11, wherein the step of forming a plurality of memory cells further comprises the steps of:
etching exposed portions of said high dielectric constant material; and
etching exposed portions of said charge trapping stack.

13. The method of claim 12, further comprising the step of forming a sidewall spacer about each of said plurality of memory cells before the step of forming said source/drain impurity doped regions.

14. The method of claim 11, further comprising the step of etching said high dielectric constant material using said cell spacers as a mask, the step of etching said high dielectric constant material performed before the step of forming said source/drain impurity doped regions.

15. The method of claim 11, further comprising the step of forming a sidewall spacer about each of said control gates of said plurality of control gates before the step of forming said source/drain impurity doped regions.

16. The method of claim 15, further comprising the step of etching said high dielectric constant material using said cell spacers and said sidewall spacers as a mask, the step of etching said high dielectric constant material performed before the step of forming said source/drain impurity doped regions.

17. The method of claim 10, wherein the step of forming a plurality of memory cells comprise the steps of:
forming a tunnel oxide layer overlying said substrate; and
forming a floating gate layer overlying said oxide layer.

18. A method for fabricating a flash memory device, the method comprising the steps of:
providing a silicon substrate;
depositing a charge trapping stack comprising a charge trapping layer overlying said silicon substrate;
depositing a layer of control gate material overlying said charge trapping stack;
selectively etching said layer of control gate material to form a plurality of control gates overlying said charge trapping layer, wherein each of said plurality of control gates is a first distance from an adjacent control gate;
conformally depositing a high dielectric constant material layer as a cell spacer material layer overlying said plurality of control gates to a thickness that is no less than said first distance;
etching said cell spacer material layer to form a cell spacer about each control gate of said plurality of control gates; and
forming a source/drain impurity doped region within said substrate adjacent a first end of said plurality of control gates and a source/drain impurity doped region within said substrate adjacent a second end of said plurality of control gates.

19. The method of claim 18, further comprising the step of depositing a high-dielectric constant material overlying said charge trapping layer, wherein the step of depositing a high-dielectric constant material is performed before the step of depositing a layer of control gate material.

20. The method of claim 19, further comprising etching said high-dielectric constant material after the step of etching said cell spacer material layer.

21. The method of claim 18, further comprising the step of depositing an oxide layer overlying said plurality of control gates before the step of depositing said cell spacer material layer.

22. The method of claim 21, further comprising the step of etching said oxide layer after the step of etching said cell spacer material layer and before the step of forming said source/drain impurity doped regions.

23. The method of claim 18, further comprising the step of etching exposed portions of said charge trapping layer that do not underlie said control gates of said column of control gates.

24. The method of claim 23, further comprising the step of globally depositing an oxide layer before the step of depositing said cell spacer material layer and after the step of etching portions of said charge trapping layer.

25. The method of claim 24, further comprising the step of etching said oxide layer after the step of etching said cell spacer material layer and before the step of forming said source/drain impurity doped regions.

* * * * *